United States Patent
Motoyama

(10) Patent No.: US 6,825,732 B2
(45) Date of Patent: Nov. 30, 2004

(54) RING OSCILLATOR WITH A DIGITALLY PROGRAMMABLE FREQUENCY

(75) Inventor: Ken L. Motoyama, Cupertino, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 10/269,338

(22) Filed: Oct. 11, 2002

(65) Prior Publication Data
US 2004/0070459 A1 Apr. 15, 2004

(51) Int. Cl.$^7$ .............................................. H03B 27/00
(52) U.S. Cl. ..................................... 331/57; 331/177 R
(58) Field of Search ............................... 331/57, 177 R, 331/175

(56) References Cited

U.S. PATENT DOCUMENTS

| | | | |
|---|---|---|---|
| 4,517,532 A | 5/1985 | Neidorff | 331/57 |
| 4,988,960 A * | 1/1991 | Tomisawa | 331/2 |
| 5,689,213 A | 11/1997 | Sher | 331/57 |
| 6,204,694 B1 | 3/2001 | Sunter et al. | 326/93 |
| 6,272,439 B1 | 8/2001 | Buer et al. | 702/75 |
| 6,359,477 B1 * | 3/2002 | Pathak | 327/112 |

* cited by examiner

Primary Examiner—Arnold Kinkead
(74) Attorney, Agent, or Firm—Park, Vaughan & Fleming, LLP

(57) ABSTRACT

One embodiment of the present invention provides a ring oscillator with a digitally programmable frequency. This ring oscillator includes an odd number of inverting stages coupled input to output to form a ring, and a programming mechanism configured to digitally program the drive strength for each inverting stage in the ring oscillator, thereby changing the propagation delay between inverting stages and thereby allowing the frequency of the ring oscillator to be adjusted. In a variation on this embodiment, a given inverting stage includes a plurality of tri-state inverters coupled in parallel, so that inputs of the tri-state inverters are coupled to a common input for the given inverting stage, and outputs of the tri-state inverters are coupled to a common output for the given inverting stage. Moreover, each of the tri-state inverters can be selectively enabled, thereby allowing the drive strength of the given inverting stage to be adjusted.

14 Claims, 5 Drawing Sheets

RING OSCILLATOR WITH A DIGITALLY PROGRAMMABLE FREQUENCY

BACKGROUND

1. Field of the Invention

The present invention relates to digital circuits. More specifically, the present invention relates to a method and an apparatus for digitally programming a frequency for a ring oscillator.

2. Related Art

Digital circuits typically operate under control of a system clock signal that is used to synchronize interactions between circuit elements. Because of the simplicity of its design, a ring oscillator is often used to generate such a clock signal.

A ring oscillator is comprised of an odd number of inverting stages connected into a ring. For example, referring to FIG. 1, ring oscillator 103 on semiconductor chip 102 includes five inverters 104–108 connected input-to-output to form a ring in which the output of the last inverter 108 feeds back into the input of the first inverter 104.

Assuming that each inverting stage is identical, this circuit produces a clock signal that oscillates with a period equal to twice the gate delay of each inverting stage multiplied by the number of inverting stages. For example, if each of the five inverters 104–108 in FIG. 1 has a one-nanosecond delay, ring oscillator 103 will oscillate with a period of 10 nanoseconds.

It is often useful to be able to dynamically change the clock frequency of a digital system. For example, the clock frequency can be decreased during latent periods of operation in order to decrease the power consumption of the digital circuit. Furthermore; it is often desirable to fine tune circuitry after fabrication to achieve a desired clock speed. Note that variations in the processes used to manufacture semiconductor chips often cause substantial variations in propagation delay through circuit elements. It is therefore not possible to determine how fast a digital circuit will operate before it is manufactured. Hence, it is typically necessary to fine tune a digital after it is manufactured to achieve a desired frequency.

A number of ring oscillator designs allow the number of inverting stages in the ring oscillator to be adjusted through fuses or semiconductor switches. For example, see U.S. Pat. No. 5,689,213, entitled "Post-Fabrication Programmable Integrated Circuit Ring Oscillator," by inventor Joseph C. Sher, filed on Aug. 23, 1995 and issued on Nov. 18, 1997. However, in these designs, inverting stages must be added or removed from the ring oscillator in pairs. This means that only coarse frequency adjustments are possible using this technique.

Hence, what is needed is a method and an apparatus for adjusting the frequency of a ring oscillator without the problems listed above.

SUMMARY

One embodiment of the present invention provides a ring oscillator with a digitally programmable frequency. This ring oscillator includes an odd number of inverting stages coupled input to output to form a ring, and a programming mechanism configured to digitally program the drive strength for each inverting stage in the ring oscillator, thereby changing the propagation delay between inverting stages and thereby allowing the frequency of the ring oscillator to be adjusted.

In a variation on this embodiment, a given inverting stage includes a plurality of tri-state inverters coupled in parallel, so that inputs of the tri-state inverters are coupled to a common input for the given inverting stage, and outputs of the tri-state inverters are coupled to a common output for the given inverting stage. Moreover, each of the tri-state inverters can be selectively enabled, thereby allowing the drive strength of the given inverting stage to be adjusted.

In a further variation, the tri-state inverters for the given inverting stage have equal drive strength, so that enabling additional tri-state inverters increases the drive strength of the given inverting stage linearly.

In a further variation, the tri-state inverters for the given inverting stage have different gate lengths and hence different drive strengths.

In a further variation, the tri-state inverters for the given inverting stage have drive strengths that vary by powers of two, so that the drive strength of the given inverting stage can be digitally programmed with a binary number.

In a further variation, a tri-state inverter in the given inverting stage includes: a first P-type transistor with a source coupled to $V_{DD}$, and a gate coupled to the input of the tri-state inverter; a second P-type transistor with a source coupled to the drain of the first P-type transistor, a gate coupled to an enable signal for the tri-state inverter and a drain coupled to the output of the tri-state inverter; a first N-type transistor with a drain coupled to the output of the tri-state inverter, and a gate coupled to the inverse of the enable signal; and a second N-type transistor with a drain coupled to the source of the first N-type transistor, a gate coupled to the input of the tri-state inverter and a source coupled to ground.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not intended to be limited to the embodiments shown, but is to be accorded the widest scope consistent with the principles and features disclosed herein.

Programmable Ring Oscillator

Figure 1:
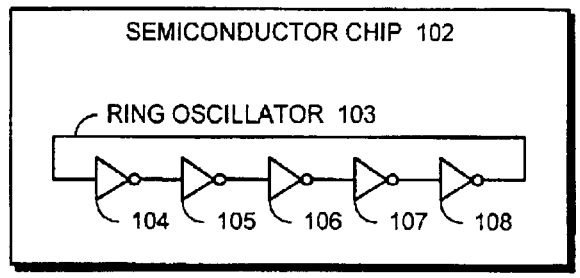
FIG. 1 illustrates a ring oscillator on a semiconductor chip.
Figure 2:
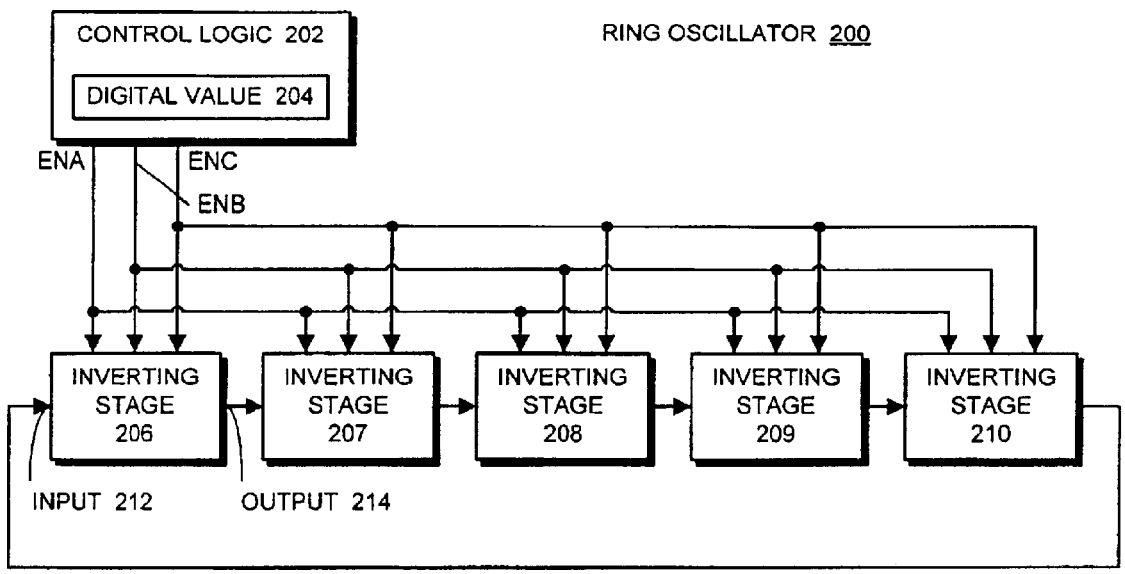
FIG. 2 illustrates a ring oscillator with a programmable frequency in accordance with an embodiment of the present invention.

FIG. 2 illustrates a ring oscillator 200 with a programmable frequency in accordance with an embodiment of the present invention. The ring oscillator 200 illustrated in FIG. 2 includes five inverting stages 206–210. However, in general any odd number of inverting stages can be used.

Ring oscillator 200 additionally includes control logic 202, which holds a digital value 204 corresponding to a frequency for ring oscillator 200. Control logic 202 uses digital value 204 to generate a set of enable signals, ENA, ENB and ENC, which feed into inverting stages 206–210. These enable signals ENA, ENB and ENC are used to selectively enable tri-state inverters that are coupled together in parallel within inverting stages 206–210. Note that FIG. 2 does not show complementary enable signals ENA_L, ENB_L and ENC_L that accompany enable signals ENA, ENB and ENC. Also note that control logic 202 can generally include any type of state machine, programmable Read-Only Memory (ROM), or other type of control mechanism that can be used to generate enable signals for inverting stages 206–210.

By selectively enabling tri-state drivers in inverting stages 206–210, control logic 202 is able to adjust the drive strength for each inverting stage in ring oscillator 200. This changes the propagation delay between inverting stages 206–210 and thereby allows the frequency of ring oscillator 200 to be adjusted. This adjustment process is described in more detail below with reference to FIGS. 3–6.

Inverting Stages

Figure 3:
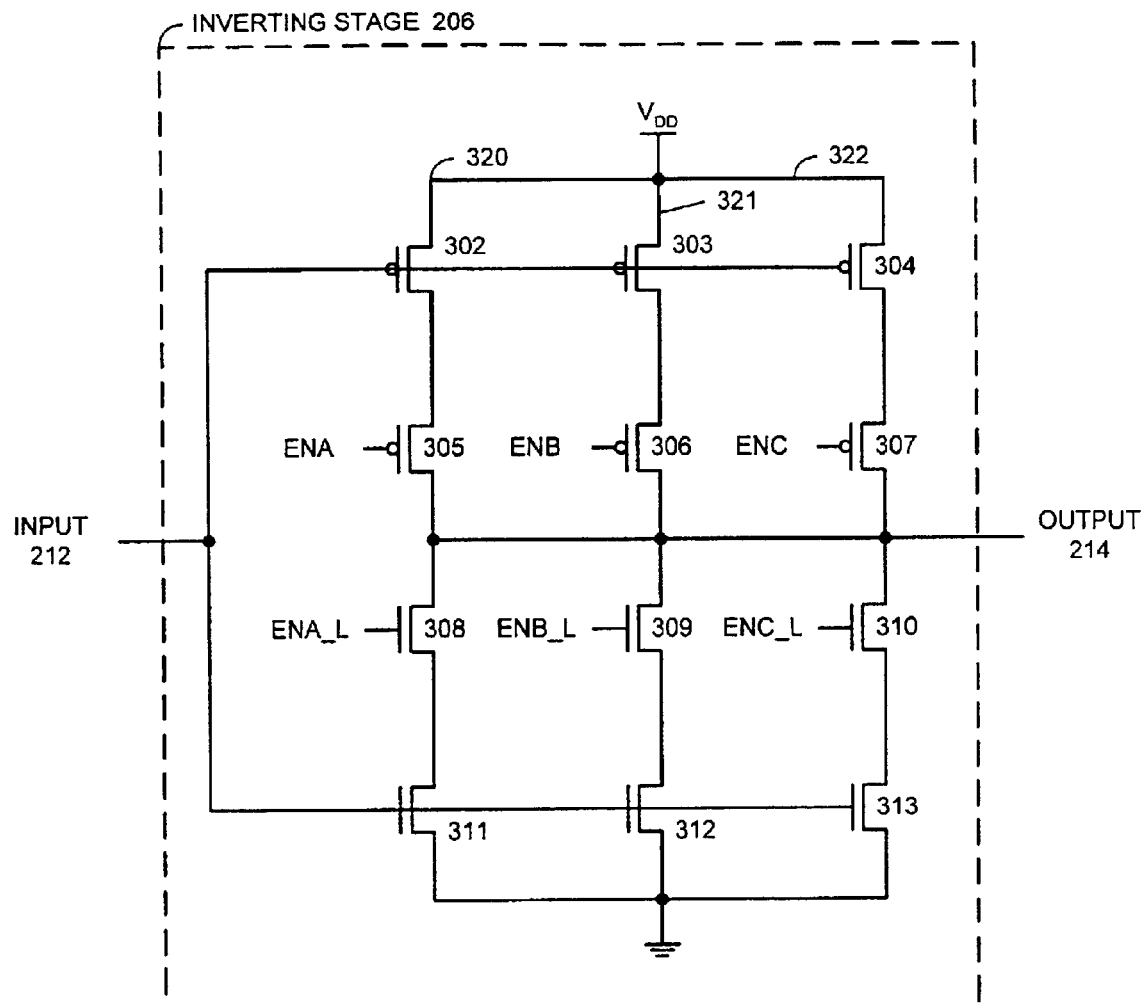
FIG. 3 illustrates an implementation of a stage in a ring oscillator in accordance with an embodiment of the present invention.

FIG. 3 illustrates an implementation of inverting stage 206 within ring oscillator 200 in accordance with an embodiment of the present invention. During operation, inverting stage 206 receives an input signal 212 and generates an inverted output signal 214 (see FIG. 2).

The implementation of inverting stage 206 in FIG. 3 includes three tri-state inverters connected in parallel. Note that in general inverting stage 206 can include any number of tri-state inverters connected in parallel, and is not limited to the three parallel tri-state inverters illustrated in FIG. 3.

As is illustrated in FIG. 3, a first tri-state inverter 320 in inverting stage 206 includes P-type transistors 302 and 305 as well as N-type transistors 308 and 311, which are coupled in series between $V_{DD}$ and ground. When enable signal ENA is asserted to a low voltage and complementary enable signal ENA_L is asserted to $V_{DD}$, P-type transistor 305 and N-type transistor 308 become transparent. This allows P-type transistor 302 and N-type transistor 311 to invert input signal 212 to produce output signal 214.

A second tri-state inverter 321 is comprised of P-type transistors 303 and 306 as well as N-type transistors 309, and 312, which are coupled in series between $V_{DD}$ and ground. Tri-state inverter 321 can similarly be enabled by asserting enable signal ENB to a low voltage and asserting complementary enable signal ENB_L to $V_{DD}$.

Finally, a third tri-state inverter 322 is comprised of P-type transistors 304 and 307 as well as N-type transistors 310 and 313, which are coupled in series between $V_{DD}$ and ground. Tri-state inverter 322 can also be enabled by asserting enable signal ENC to a low voltage and asserting complementary enable signal ENC_L to $V_{DD}$.

By selectively enabling different combinations of tri-state inverters 320, 321 and 322, different drive strengths can be generated by inverting stage 206. In one embodiment of the present invention, the drive strengths of inverters 320, 321 and 322 are all the same. In this case, enabling additional inverters increases the drive strength of inverting stage 206 linearly. Note the drive strength for a given tri-state inverter can be adjusted prior to manufacture by adjusting the gate widths of the transistors in the given tri-state inverter.

In another embodiment of the present invention, the drive strengths of inverters 320, 321 and 322 vary by successive by powers of two. For example, the drive strength of the second inverter 321 can be twice the drive strength of the first inverter 320, and the drive strength of the third inverter 322 can be twice the drive strength of the second inverter 321. In this way, a three digit binary value can be used to selectively enable different combinations of inverters 320, 321 and 322 to produce a corresponding drive strength that is proportionate to the three digit binary value.

Figure 4:
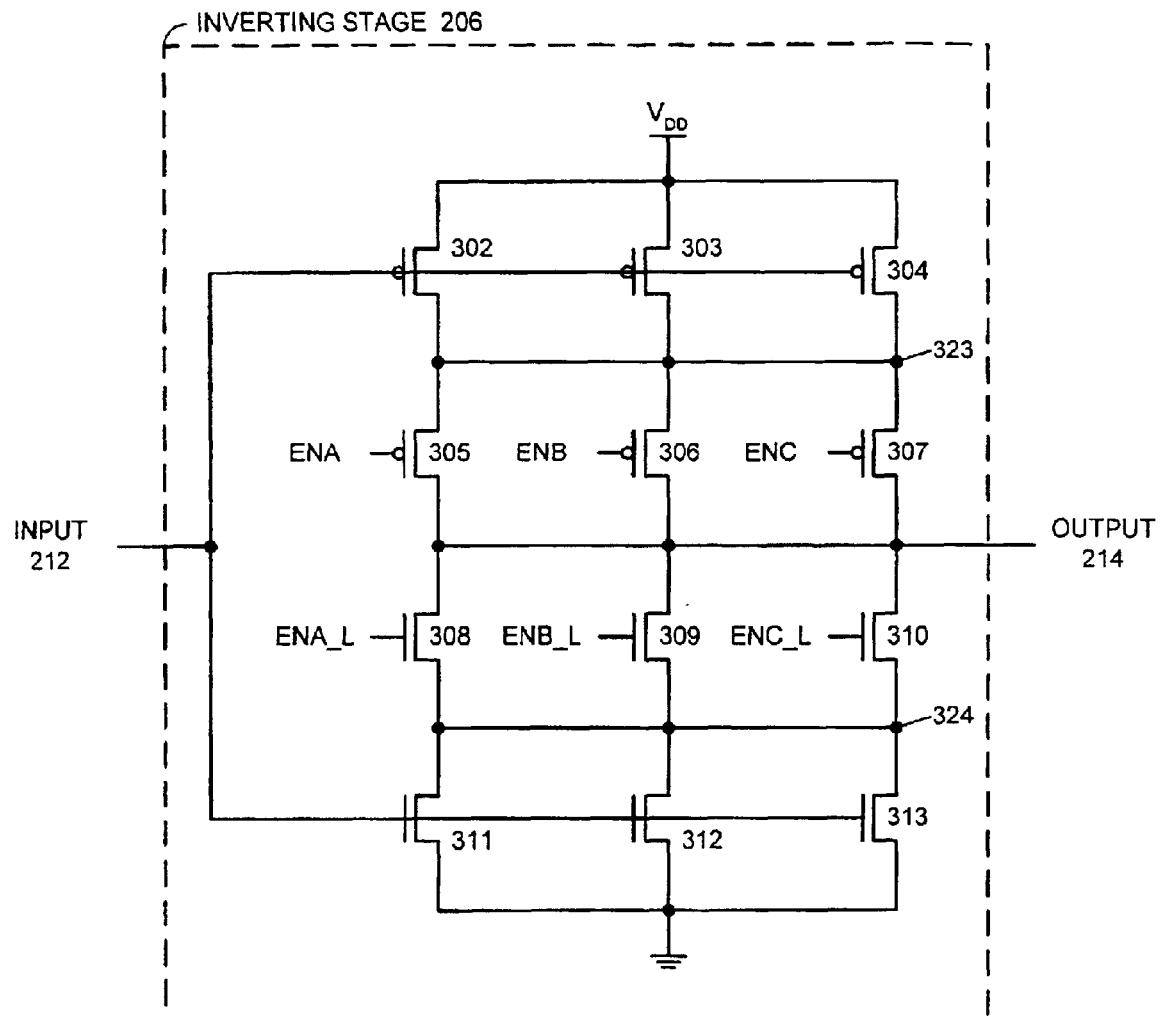
FIG. 4 illustrates an alternative implementation of a stage in a ring oscillator in accordance with an embodiment of the present invention.

FIG. 4 illustrates an alternative implementation of inverting stage 206 in accordance with an embodiment of the present invention. This alternative implementation is the same as the implementation illustrated in FIG. 3, except that the drains of P-type transistors 302–304 have been coupled together at terminal 323, and the drains of N-type transistors 311–313 have been coupled together at terminal 324. In this embodiment, P-type transistors 302–303 and N-type transistors 311–313 always remain active.

Moreover, enable signals ENA, ENB and ENC determine the resistance between terminal 323 and output terminal 214, and enable signals ENA_L, ENB_L, and ENC_L determine the resistance between terminal 324 and output terminal 214. In this way, enable signals ENA, ENA_L, ENB, ENB_L, ENC, and ENC_L determine the drive strength of inverting stage 206.

Figure 5:
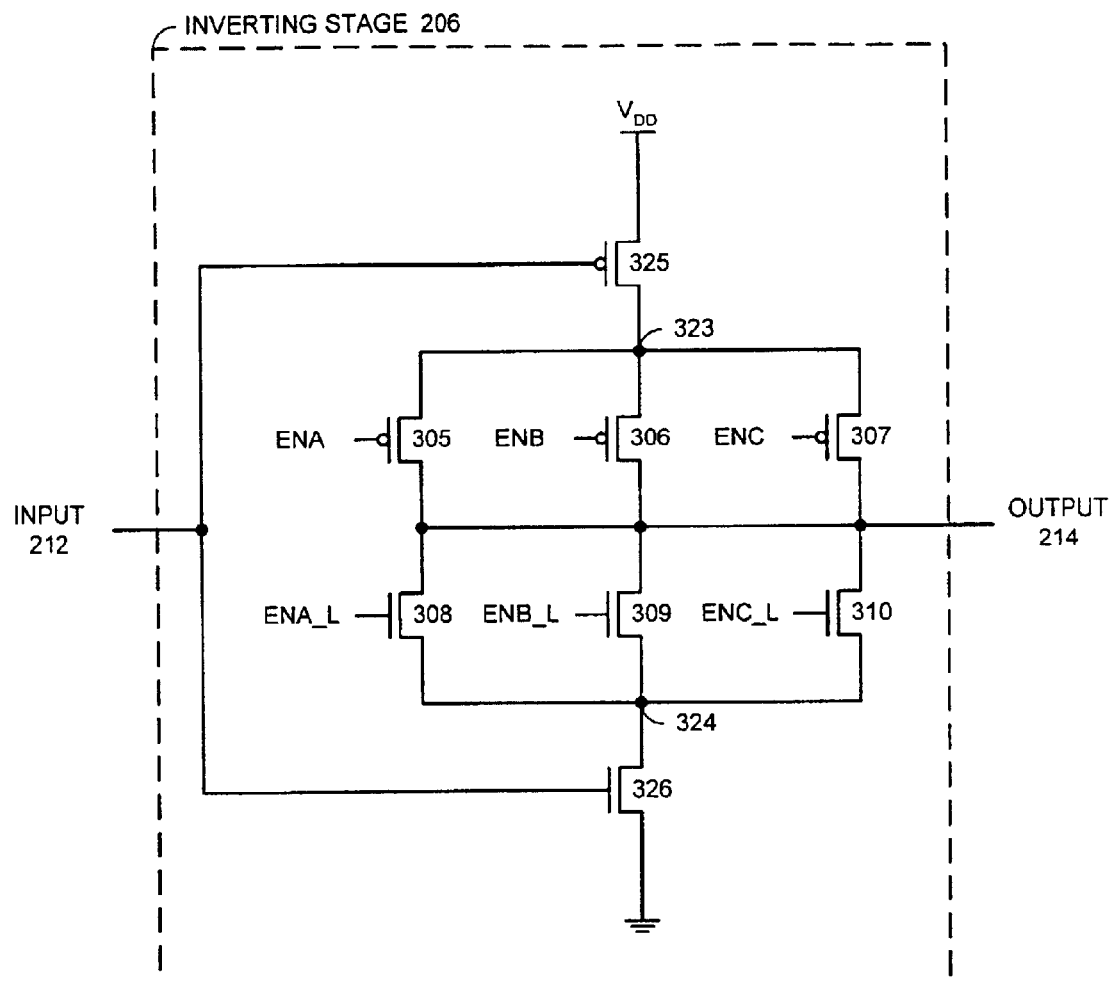
FIG. 5 illustrates yet another implementation of a stage in a ring oscillator in accordance with an embodiment of the present invention.

FIG. 5 illustrates yet another implementation of inverting stage 206 in accordance with another embodiment of the present invention. This implementation is a variation on the embodiment illustrated in FIG. 4 in which the three parallel P-type transistors 302–304 are replaced be a single P-type transistor 325, and the three parallel N-type transistors 311–313 are replaced by a single N-type transistor 326. This embodiment functions the same way as the embodiment illustrated in FIG. 4, wherein enable signals ENA, ENB, and ENC determine the resistance between terminal 323 and output 214, and enable signals ENA_L, ENB_L, and ENC_L determine the resistance between terminal 324 and output terminal 214. This allows enable signals ENA, ENA_L, ENB, ENB_L, ENC, and ENC_L to determine the drive strength of inverting stage 206.

Although the enable signals illustrated in FIGS. 3–5 are "active low," which means that they are asserted with a low voltage, the present invention is not meant to be limited to circuits with active low enable signals. Equivalent circuitry which makes use of "active high" enable signals can also be used.

Configuration Process

Figure 6:
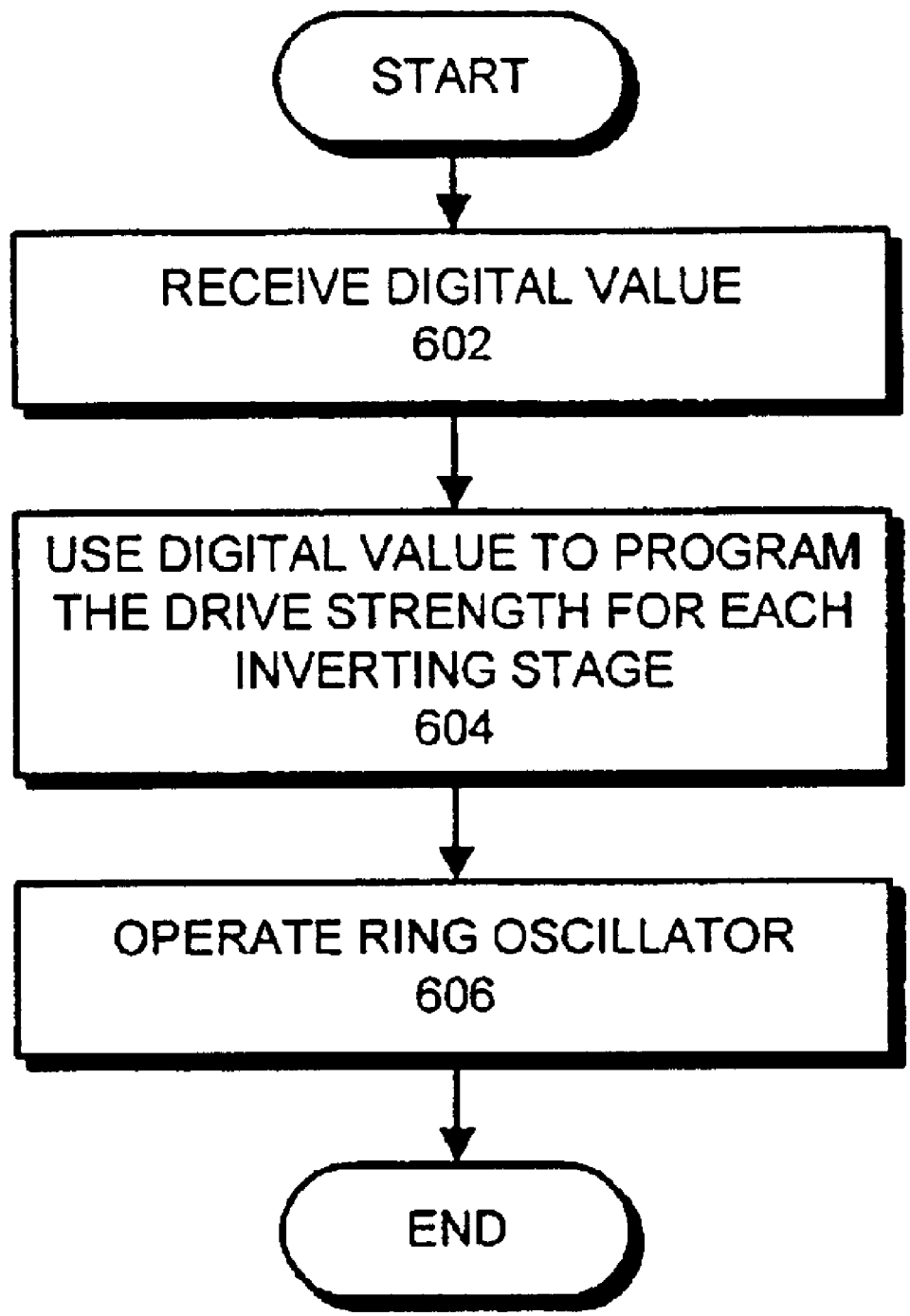
FIG. 6 is a flow chart of the process of configuring the frequency of a ring oscillator in accordance with an embodiment of the present invention.

FIG. 6 is a flow chart of the process of configuring the frequency of a ring oscillator in accordance with an embodiment of the present invention. The process starts when control logic 202 produces a digital value 204 composed of a series of ones and zeros associated with a specific frequency for ring oscillator 200 (see FIG. 2) (step 602). This digital value 204 can be received from an external source, can be programmed, or can be generated internally by control logic 202.

Next, control logic 202 uses digital value 204 to program the drive strength for the inverting stages by asserting enable signals ENA, ENA_L, ENB, ENB_L, ENC and ENC_L (step 604). This can involve performing a function on digital value 204 to compute enable signals ENA, ENA_L, ENB, ENB_L, ENC and ENC_L. Ring oscillator 200 is then able to operate at the selected frequency (step 606).

Although the present invention is described in the context of the implementations illustrated in FIGS. 2–6, the present invention is not meant to be limited to these specific implementations. For example, the present invention can generally use any technique for varying the drive strength of inverting stages in a ring oscillator based on a digital input, and is not meant to be limited to the techniques illustrated in FIGS. 2–6.

The foregoing descriptions of embodiments of the present invention have been presented for purposes of illustration and description only. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A ring oscillator with a digitally programmable frequency, comprising:

an odd number of inverting stages coupled input to output to form a ring, wherein a given inverting stage includes:
 a plurality of tri-state inverters coupled in parallel, so that inputs of the tri-state inverters are coupled to a common input for the given inverting stage, and outputs of the tri-state inverters are coupled to a common output for the given inverting stage, wherein a tri-state inverter in the given inverting stage includes:
  a first P-type transistor with a source coupled to $V_{DD}$, and a gate coupled to the input of the tri-state inverter,
  a second P-type transistor with a source coupled to the drain of the first P-type transistor, a gate coupled to an enable signal for the tri-state inverter and a drain coupled to the output of the tri-state inverter,
  a first N-type transistor with a drain coupled to the output of the tri-state inverter, and a gate coupled to the inverse of the enable signal, and
  a second N-type transistor with a drain coupled to the source of the first N-type transistor, a gate coupled to the input of the tri-state inverter and a source coupled to ground,
 wherein each of the tri-state inverters can be selectively enabled, thereby allowing the drive strength of the given inverting stage to be adjusted; and
a programming mechanism configured to digitally program the drive strength for each inverting stage in the ring oscillator, thereby changing the propagation delay between inverting stages and thereby allowing the frequency of the ring oscillator to be adjusted.

2. The ring oscillator of claim 1, wherein the tri-state inverters for the given inverting stage have equal drive strength, so that enabling additional tri-state inverters increases the drive strength of the given inverting stage linearly.

3. The ring oscillator of claim 1, wherein the tri-state inverters for the given inverting stage have different gate lengths and hence different drive strengths.

4. The ring oscillator of claim 3, wherein the tri-state inverters for the given inverting stage have drive strengths that vary by powers of two, so that the drive strength of the given inverting stage can be digitally programmed with a binary number.

5. A method for digitally programming a frequency of a ring oscillator, wherein the ring oscillator includes an odd number of inverting stages coupled input to output to form a ring, comprising:

receiving a digital value associated with the frequency for the ring oscillator; and
using the digital value to program a drive strength for each inverting stage in the ring oscillator, wherein a given inverting stage includes:
 a plurality of tri-state inverters coupled in parallel, so that inputs of the tri-state inverters are coupled to a common input for the given inverting stage, and outputs of the tri-state inverters are coupled to a common output for the given inverting stage, wherein a tri-state inverter in the given inverting stage includes:
  a first P-type transistor with a source coupled to $V_{DD}$, and a gate coupled to the input of the tri-state inverter,
  a second P-type transistor with a source coupled to the drain of the first P-type transistor, a gate coupled to an enable signal for the tri-state inverter and a drain coupled to the output of the tri-state inverter,
  a first N-type transistor with a drain coupled to the output of the tri-state inverter, and a gate coupled to the inverse of the enable signal, and
  a second N-type transistor with a rain coupled to the source of the first N-type transistor, a
  gate coupled to the input of the tri-state inverter and a source coupled to ground,
 wherein each of the tri-state inverters can be selectively enabled, thereby allowing the drive strength of the given inverting stage to be adjusted;
wherein programming the drive strength changes the propagation delay between inverting stages and thereby adjusts the frequency of the ring oscillator.

6. The method of claim 5, wherein the tri-state inverters for the given inverting stage have equal drive strength, so that enabling additional tri-state inverters increases the drive strength of the given inverting stage linearly.

7. The method of claim 5, wherein the tri-state inverters for the given inverting stage have different gate lengths and hence different drive strengths.

8. The method of claim 7, wherein the tri-state inverters for the given inverting stage have drive strengths that vary by powers of two, so that the drive strength of the given inverting stage can be digitally programmed with a binary number.

9. A semiconductor chip including a ring oscillator with a digitally programmable frequency, comprising:

a semiconductor substrate;
the ring oscillator on the semiconductor substrate, wherein the ring oscillator includes an odd number of inverting stages coupled input to output to form a ring, wherein a given inverting stage includes:
 a plurality of tri-state inverters coupled in parallel, so that inputs of the tri-state inverters are coupled to a common input for the given inverting stage, and outputs of the tri-state inverters are coupled to a common output for the given inverting stage, wherein a tri-state inverter in the given inverting stage includes:
  a first P-type transistor with a source coupled to $V_{DD}$, and a gate coupled to the input of the tri-state inverter,
  a second P-type transistor with a source coupled to the drain of the first P-type transistor, a gate coupled to an enable signal for the tri-state inverter and a drain coupled to the output of the tri-state inverter, a first N-type transistor with a drain coupled to the output of the tri-state inverter, and a gate coupled to the inverse of the enable signal, and a second N-type transistor with a drain coupled to the source of the first N-type transistor, a gate coupled to the input of the tri-state inverter and a source coupled to ground, wherein each of the tri-state inverters can be selectively enabled, thereby allowing the drive strength of the give inverting stage to be adjusted; and a programming mechanism configured to digitally program the drive strength for each inverting stage in the ring oscillator, thereby changing the propagation delay between inverting stages and thereby allowing the frequency of the ring oscillator to be adjusted.

10. The semiconductor chip of claim 9, wherein the tri-state inverters for the given inverting stage have equal drive strength, so that enabling additional tri-state inverters increases the drive strength of the given inverting stage linearly.

11. The semiconductor chip of claim 9, wherein the tri-state inverters for the given inverting stage have different gate lengths and hence different drive strengths.

12. The semiconductor chip of claim 11, wherein the tri-state inverters for the given inverting stage have drive strengths that vary by powers of two, so that the drive strength of the given inverting stage can be digitally programmed with a binary number.

13. The semiconductor chip of claim 9, wherein the semiconductor chip includes a central processing unit.

14. A computer system including a ring oscillator with a digitally programmable frequency, comprising:

a processor;

a memory;

the ring oscillator, wherein the ring oscillator includes an odd number of inverting stages coupled input to output to form a ring, wherein a given inverting stage includes:

a plurality of tri-state inverters coupled in parallel, so that inputs of the tri-state inverters are coupled to a common input for the given inverting stage, and outputs of the tri-state inverters are coupled to a common output for the given inverting stage, wherein a tri-state inverter in the given inverting stage includes:

a first P-type transistor with a source coupled to $V_{DD}$, and a gate coupled to the input of the tri-state inverter, a second P-type transistor with a source coupled to the drain of the first P-type transistor, a gate coupled to an enable signal for the tri-state inverter and a drain coupled to the output of the tri-state inverter, a first N-type transistor with a drain coupled to the output of the tri-state inverter, and a gate coupled to the inverse of the enable signal, and a second N-type transistor with a drain coupled to the source of the first N-type transistor, a gate coupled to the input of the tri-state inverter and a source coupled to ground, wherein each of the tri-state inverters can be selectively enabled, thereby allowing the drive strength of the given inverting stage to be adjusted; and a programming mechanism configured to digitally program the drive strength for each inverting stage in the ring oscillator, thereby changing the propagation delay between inverting stages and thereby allowing the frequency of the ring oscillator to be adjusted.

* * * * *

UNITED STATES PATENT AND TRADEMARK OFFICE
CERTIFICATE OF CORRECTION

PATENT NO. : 6,825,732 B2
DATED : November 30, 2004
INVENTOR(S) : Ken L. Motoyama It is certified that error appears in the above-identified patent and that said Letters Patent is hereby corrected as shown below:

<u>Column 6,</u>
Line 24, please delete the word, "rain" and replace with the word -- drain --.

Signed and Sealed this

Twenty-second Day of February, 2005

JON W. DUDAS
*Director of the United States Patent and Trademark Office*